US011798704B2

United States Patent
Chen et al.

(10) Patent No.: US 11,798,704 B2
(45) Date of Patent: Oct. 24, 2023

(54) PEROVSKITE RADIOVOLTAIC-PHOTOVOLTAIC BATTERY

(71) Applicant: CONTEMPORARY AMPEREX TECHNOLOGY CO., LIMITED, Ningde (CN)

(72) Inventors: Changsong Chen, Ningde (CN); Bao Tu, Ningde (CN); Wenming Guo, Ningde (CN); Yongsheng Guo, Ningde (CN); Guodong Chen, Ningde (CN); Chuying Ouyang, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 18/327,923

(22) Filed: Jun. 2, 2023

(65) Prior Publication Data

US 2023/0307152 A1    Sep. 28, 2023

Related U.S. Application Data

(63) Continuation of application No. PCT/CN2021/143550, filed on Dec. 31, 2021.

(51) Int. Cl.
*G21H 1/12*    (2006.01)
*G21H 1/04*    (2006.01)
(Continued)

(52) U.S. Cl.
CPC .............. *G21H 1/12* (2013.01); *G21H 1/04* (2013.01); *H10K 30/40* (2023.02); *H10K 30/50* (2023.02);
(Continued)

(58) Field of Classification Search
None
See application file for complete search history.

(56) References Cited

U.S. PATENT DOCUMENTS

2018/0372891 A1    12/2018    Cao

FOREIGN PATENT DOCUMENTS

| CN | 104409127 A | 3/2015 |
|---|---|---|
| CN | 105869695 A | 8/2016 |

(Continued)

OTHER PUBLICATIONS

Gao et al., Energy Environ. Mater., 2022, 0, e12513, p. 1-8 (Year: 2022).*

(Continued)

*Primary Examiner* — Eli S Mekhlin
(74) *Attorney, Agent, or Firm* — LADAS & PARRY LLP

(57) ABSTRACT

A perovskite radiovoltaic-photovoltaic battery having a first electrode, a first charge transport layer, a perovskite layer, a second charge transport layer, and a second electrode in sequence, wherein the first electrode is a transparent electrode, the first charge transport layer is an electron transport layer and the second charge transport layer is a hole transport layer, or the first charge transport layer is a hole transport layer and the second charge transport layer is an electron transport layer, and the second electrode is a radiating electrode formed by compounding an electrical conductor material with a radioactive source.

14 Claims, 1 Drawing Sheet

(51) Int. Cl.
    *H10K 30/40*    (2023.01)
    *H10K 30/50*    (2023.01)
    *H10K 85/50*    (2023.01)
    *H10K 71/60*    (2023.01)
    *H10K 71/16*    (2023.01)
    *H10K 30/82*    (2023.01)
    *H10K 101/40*   (2023.01)
    *H10K 101/30*   (2023.01)

(52) U.S. Cl.
    CPC ............ *H10K 30/82* (2023.02); *H10K 71/16* (2023.02); *H10K 71/60* (2023.02); *H10K 85/50* (2023.02); *H10K 2101/30* (2023.02); *H10K 2101/40* (2023.02)

(56) References Cited

FOREIGN PATENT DOCUMENTS

| | | |
|---|---|---|
| CN | 107093486 A | 8/2017 |
| CN | 108877983 A | 11/2018 |
| CN | 111261311 A | 6/2020 |

OTHER PUBLICATIONS

ISR for International Application PCT/CN2021/143550 mailed Aug. 22, 2022.
Written Opinion for International Application Application PCT/CN2021/143550 dated Aug. 22, 2022.

\* cited by examiner

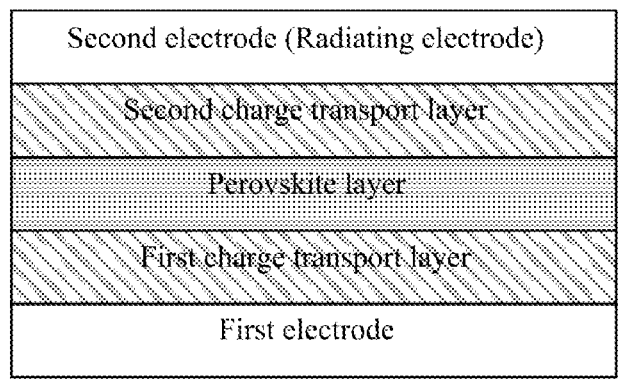

PEROVSKITE RADIOVOLTAIC-PHOTOVOLTAIC BATTERY

CROSS-REFERENCE TO RELATED APPLICATIONS

This application is a continuation of International application PCT/CN2021/143550 filed on Dec. 31, 2021. The subject matter of which is incorporated herein by reference.

TECHNICAL FIELD

The present invention relates to a perovskite radiovoltaic-photovoltaic battery and a method for manufacturing same.

BACKGROUND

A photovoltaic battery is a photoelectric converting device that converts light energy into electrical energy, which has a high energy conversion effect. The photovoltaic battery enables the effective use of clean and non-polluting solar energy. However, the photovoltaic battery is greatly affected by weather and season.

A nuclear battery, also referred to as an isotope battery, is a device that converts the energy released from the decay of a radioactive isotope into electrical energy. It has the advantages, such as a long service life, an excellent environmental stability and an enough small size, but the energy conversion efficiency thereof is low. Nuclear battery converts energy in multiple manners. The nuclear battery that converts the energy of high-energy particles from radioactive sources into photogenerated carriers by means of the photoelectric effect and forms power output by PN junction or PIN junction is referred to as a radio-voltaic nuclear battery (referred as a radiovoltaic battery hereinbelow for short). The working principle thereof is similar to that of a photovoltaic battery.

If it is possible to organically combine the radiovoltaic battery and the photovoltaic battery and make good use of their respective advantages synergistically, a radiovoltaic-photovoltaic battery with an excellent environmental stability and a high energy conversion efficiency can be realized.

SUMMARY OF THE INVENTION

In view of the above issues, the present invention has been made with an objective to provide a perovskite radiovoltaic-photovoltaic battery, which can converts both isotopic decay particles or other energy particles and solar energy into electrical energy, thus reducing the influence of light conditions, achieving an enhanced environmental stability, and being able to improve the energy conversion efficiency. Another objective of the present invention is also to provide a method for manufacturing a perovskite radiovoltaic-photovoltaic battery. The method can reduce the procedures for battery manufacturing and improve the production efficiency.

A first aspect of the present invention provides a perovskite radiovoltaic-photovoltaic battery having a first electrode, a first charge transport layer, a perovskite layer, a second charge transport layer, and a second electrode in sequence, wherein the first electrode is a transparent electrode, the first charge transport layer is an electron transport layer and the second charge transport layer is a hole transport layer, or the first charge transport layer is a hole transport layer and the second charge transport layer is an electron transport layer, and the second electrode is a radiating electrode formed by compounding a radioactive source with an electrical conductor material.

In some embodiments, the radioactive source is selected from at least one of an α-type radioactive source, a β-type radioactive source, an X-ray radioactive source and a γ-ray radioactive source.

In some embodiments, the α-type radioactive source is selected from at least one of $^{210}$Po or a compound thereof, $^{228}$Th or a compound thereof, $^{235}$U or a compound thereof, $^{238}$Pu or a compound thereof, $^{238}$PuO$_2$ microsphere, $^{241}$Am or a compound thereof, $^{242}$Cm or a compound thereof, and $^2$Cm or a compound thereof; and the β-type radioactive source is selected from at least one of $(C_4H_3{}^3H_{5-})_n$, $^3H_2$, Ti$^3$H$_4$, $^{14}$C or a compound thereof, $^{35}$S or a compound thereof, $^{63}$Ni or a compound thereof, $^{90}$Sr or a compound thereof, $^{90}$Sr/$^{90}$Y, $^{99}$Tc or a compound thereof, $^{106}$Ru or a compound thereof, $^{137}$Cs or a compound thereof, $^{144}$Ce or a compound thereof, $^{147}$Pm or a compound thereof, $^{151}$Sm or a compound thereof, and $^{226}$Ra or a compound thereof.

In some embodiments, the radioactive source is preferably a β-type radioactive source, and more preferably is selected from at least one of Ti$^3$H$_4$, $^{63}$Ni, and $^{90}$Sr/$^{90}$Y.

In some embodiments, the content of the radioactive source in the radiating electrode is no more than 90 wt %, and preferably 5-30 wt %.

In some embodiments, the first charge transport layer and the second charge transport layer has a semiconductor material of at least one of the following materials and derivatives thereof: an imide compound, a quinone compound, fullerene and a derivative thereof, poly[bis(4-phenyl)(2,4,6-trimethylphenyl)amine], 2,2',7,7'-tetra(N,N-p-methoxyanilino)-9,9'-spirobifluorene, methoxytriphenylamine-fluoroformamidine, poly(3,4-ethylenedioxythiophene):polystyrene sulfonic acid, poly-3-hexylthiophene, triptycene-cored triphenylamine, 3,4-ethylenedioxythiophene-methoxytriphenylamine, N-(4-aniline)carbazole-spirobifluorene, polythiophene, a metal oxide (with the metal element being selected from Mg, Ni, Cd, Zn, In, Pb, Mo, W, Sb, Bi, Cu, Hg, Ti, Ag, Mn, Fe, V, Sn, Zr, Sr, Ga, or Cr), silicon oxide, strontium titanate, calcium titanate, lithium fluoride, calcium fluoride, cuprous thiocyanate, methyl [6,6]-phenyl-C61-butyrate, or methyl [6,6]-phenyl-C71-butyrate.

In some embodiments, the electrical conductor material of the first electrode and the second electrode is an organic electrically conductive material, an inorganic electrically conductive material, or an electrically conductive material obtained by mixing an organic electrically conductive material and an inorganic electrically conductive material; the organic electrically conductive material is selected from at least one of a polymer of (3,4-ethylenedioxythiophene monomer), polythiophene, polyacetylene, polypyrrole, polyphenylene, polyphenylacetylene, polyaniline, an epoxy resin, a phenolic resin, and polypropylene, and the inorganic electrically conductive material is selected from at least one of a transparent conductive oxide, a metal, and a carbon derivative.

In some embodiments, the perovskite in the perovskite layer has a chemical formula of ABX$_3$, where A is selected from at least one of an methylamine cation of MA$^+$, a formamidine cation of FA$^+$, and a cesium cation of Cs$^+$, B is selected from at least one of a lead cation of Pb$^{2+}$ and a tin cation of Sn$^{2+}$, and X is a halide ion, COO$^-$ or a mixed anion thereof.

In some embodiments, the first electrode has a thickness of 50 nm-1000 nm; and/or the first charge transport layer has a thickness of 10 nm-1000 nm; and/or the perovskite layer has a thickness of 50 nm-2000 nm; and/or the second charge transport layer has a thickness of 10 nm-1000 nm; and/or the second electrode has a thickness of 10 nm-500 nm.

In some embodiments, when the second charge transport layer is an electron transport layer, the difference between the Fermi level of the second electrode and the conduction band bottom energy level of the second charge transport layer is −1.0-1.0 eV, and the difference between the Fermi level of the second electrode and the valence band top energy level of the second charge transport layer is ≥1.0 eV.

In some embodiments, when the second charge transport layer is a hole transport layer, the difference between the Fermi level of the second electrode and the valence band top energy level of the second charge transport layer is −1.0-1.0 eV, and the difference between the Fermi level of the second electrode and the conduction band bottom energy level of the second charge transport layer is ≤−1.0 eV.

A second aspect of the present invention provides a method for manufacturing a perovskite radiovoltaic-photovoltaic battery, which is used to manufacture the perovskite radiovoltaic-photovoltaic battery of the present invention. The method for manufacturing a perovskite radiovoltaic-photovoltaic battery of the present invention includes: a procedure of forming a first charge transport layer on a first electrode; a procedure of forming a perovskite layer on the first charge transport layer; a procedure of forming a second charge transport layer on the perovskite layer; and a procedure of forming a second electrode on the second charge transport layer; wherein the second electrode is formed by compounding a radioactive source with an electrical conductor material by means of a process selected from at least one of chemical bath deposition, electrochemical deposition, chemical vapor deposition, physical epitaxial growth, thermal evaporation co-evaporation, atomic layer deposition, magnetron sputtering, precursor solution spin coating, precursor solution slit coating, precursor solution blade coating, and mechanical pressing.

In some embodiments, the second electrode is formed by compounding a radioactive source with an electrical conductor material by at least one process of thermal evaporation co-evaporation, magnetron sputtering, and precursor solution spin coating.

Invention Effects

According to the present invention, a perovskite radiovoltaic-photovoltaic battery having a first electrode, a first charge transport layer, a perovskite layer, a second charge transport layer, and a second electrode in sequence can be provided; wherein the second electrode is a radiating electrode formed by compounding an electrical conductor material with a radioactive source, and thus the perovskite radiovoltaic-photovoltaic battery of the present invention can convert both isotopic decay particles or other energy particles and solar energy into electrical energy and can improve the energy conversion efficiency. Moreover, in the perovskite radiovoltaic-photovoltaic battery of the present invention, the second electrode is formed by compounding an electrical conductor material with a radioactive source, which can reduce the number of hetero-interfaces in the structure of the battery, thus improving the performance of the battery.

In the method for manufacturing a perovskite radiovoltaic-photovoltaic battery according to the present invention, the second electrode is formed by compounding a radioactive source with an electrical conductor material, which can reduce the procedures for battery manufacturing and improve the production efficiency.

BRIEF DESCRIPTION OF THE DRAWINGS

FIG. 1 is a schematic diagram showing the structure of the perovskite radiovoltaic-photovoltaic battery of the present invention.

DETAILED DESCRIPTION

Hereafter, embodiments of a perovskite radiovoltaic-photovoltaic battery of the present invention and a method for manufacturing same are specifically disclosed in the detailed description with reference to the accompanying drawing as appropriate. However, unnecessary detailed illustrations may be omitted in some instances. For example, there are situations where detailed description of well known items and repeated description of actually identical structures are omitted. This is to prevent the following description from being unnecessarily verbose, and facilitates understanding by those skilled in the art. Moreover, the accompanying drawing and the descriptions below are provided for enabling those skilled in the art to fully understand the present application, rather than limiting the subject matter disclosed in claims.

In the description of the embodiments of the present invention, the technical terms "first", "second", etc., are merely used for distinguishing different objects, and should not be construed as indicating or implying relative importance or implicitly indicating the number, particular order or primary-secondary relationship of the technical features modified thereby.

In an embodiment of the present invention, a perovskite radiovoltaic-photovoltaic battery is provided. The perovskite radiovoltaic-photovoltaic battery is as shown in FIG. 1, which has a first electrode, a first charge transport layer, a perovskite layer, a second charge transport layer, and a second electrode in sequence.

The first electrode is a transparent electrode, which can allow sunlight to income from the first electrode, and the perovskite radiovoltaic-photovoltaic battery of the present invention can use the incident sunlight from the first electrode for converting light energy into electrical energy.

The first charge transport layer is an electron transport layer and the second charge transport layer is a hole transport layer, or the first charge transport layer is a hole transport layer and the second charge transport layer is an electron transport layer. The first charge transport layer, the perovskite layer, and the second charge transport layer together form a PIN-structured functional layer of the battery.

In the perovskite radiovoltaic-photovoltaic battery of the present invention, the second electrode is a radiating electrode formed by compounding a radioactive source with an electrical conductor material. By making the second electrode radioactive, the high-energy particles generated from the radioactive source can be absorbed by the perovskite layer for energy conversion in the PIN-structured functional layer of the battery.

The second electrode is formed by compounding a radioactive source with an electrical conductor material, and thus the number of hetero-interfaces in the structure of the battery can be reduced, such that the redundant interface matching and the occurrence of interface defects are reduced, the redundant series resistance can also be lowered, and the charge transport efficiency in the device is improved, thereby improving the performance of the battery. In addition, the second electrode formed by compounding a radioactive source with an electrical conductor material can reduce the structural volume of the second electrode, which is beneficial to the cascading of the battery and allows its flexible application in production; moreover, the process for other structures in the battery is not affected.

The radioactive source may be selected from at least one of an α-type radioactive source, a β-type radioactive source, an X-ray radioactive source and a γ-ray radioactive source. Specifically, the α-type radioactive source may be selected from at least one of $^{210}$Po or a compound thereof, $^{228}$Th or a compound thereof, $^{235}$U or a compound thereof, $^{238}$Pu or a compound thereof, $^{238}$PuO$_2$ microsphere, $^{241}$Am or a compound thereof, $^{242}$Cm or a compound thereof, and $^{244}$Cm or a compound thereof; and the β-type radioactive source may be selected from at least one of $(C_4H_3{}^3H_{5-})_n$, $^3H_2$, $Ti^3H_4$, $^{14}$C or a compound thereof, $^{35}$S or a compound thereof, $^{63}$Ni or a compound thereof, $^{90}$Sr or a compound thereof, $^{90}$Sr/$^{90}$Y, $^{99}$Tc or a compound thereof, $^{106}$Ru or a compound thereof, $^{137}$Cs or a compound thereof, $^{144}$Ce or a compound thereof, $^{147}$Pm or a compound thereof, $^{151}$Sm or a compound thereof, and $^{226}$Ra or a compound thereof.

The radioactive source is preferably a β-type radioactive source, and more preferably is selected from at least one of $Ti^3H_4$, $^{63}$Ni or a compound thereof, and $^{90}$Sr/$^{90}$Y.

Since the β-type radiative source is of a relatively low radiation particle energy and a high safety, it has small radiation effect on perovskite and other structures in the battery. When the radioactive source is selected from at least one of $Ti^3H_4$, $^{63}$Ni or a compound thereof, and $^{90}$Sr/$^{90}$Y, the preparation process using same shows high compatibility and good controllability.

With regard to the content of the radioactive source, the content of the radioactive source in the radiating electrode is no more than 90 wt %, and preferably 5-30 wt %.

The perovskite substance in the perovskite layer of the perovskite radiovoltaic-photovoltaic battery of the present invention has a chemical formula of $ABX_3$, where A is selected from at least one of a methylamine cation of MAP, a formamidine cation of FA$^+$, and a cesium cation of Cs$^+$, B is selected from at least one of a lead cation of Pb$^{2+}$ and a tin cation of Sn$^{2+}$, and X is selected from at least one of a halide anion (F$^-$, Cl$^-$, Br$^-$, and I$^-$), and COO$^-$. Perovskite is used as an absorber material to adsorb sunlight and the radiation particles from the radioactive source.

In the perovskite radiovoltaic-photovoltaic battery of the present invention, the semiconductor material of the charge transport layers is an n-type semiconductor material or a p-type semiconductor material; the first charge transport layer comprises an n-type semiconductor material and the second charge transport layer comprises a p-type semiconductor material, or the first charge transport layer comprises a p-type semiconductor material and the second charge transport layer comprises an n-type semiconductor material.

As the above-mentioned semiconductor material, examples can be at least one of the following materials and derivatives thereof: an imide compound, a quinone compound, fullerene (C60) and a derivative thereof, poly[bis(4-phenyl)(2,4,6-trimethylphenyl)amine] (PTAA), 2,2',7,7'-tetra(N,N-p-methoxyanilino)-9,9'-spirobifluorene (Spiro-OMeTAD), methoxytriphenylamine-fluoroformamidine (OMeTPA-FA), poly(3,4-ethylenedioxythiophene):polystyrene sulfonic acid (PE DOT:PSS), poly-3-hexylthiophene (P3HT), triptycene-cored triphenylamine (H101), 3,4-ethylenedioxythiophene-methoxytriphenylamine (EDOT-OMeTPA), N-(4-aniline)carbazole-spirobifluorene (CzPAF-SBF), polythiophene, a metal oxide (with the metal element being selected from Mg, Ni, Cd, Zn, In, Pb, Mo, W, Sb, Bi, Cu, Hg, Ti, Ag, Mn, Fe, V, Sn, Zr, Sr, Ga, or Cr), silicon oxide ($SiO_2$), strontium titanate ($SrTiO_3$), calcium titanate ($CaTiO_3$), lithium fluoride (LiF), calcium fluoride ($CaF_2$), cuprous thiocyanate (CuSCN), methyl [6,6]-phenyl-C61-butyrate (PC60BM), or methyl [6,6]-phenyl-C71-butyrate (PC70BM).

The n-type semiconductor material is preferably tin dioxide, titanium dioxide, zinc oxide, C60, methyl [6,6]-phenyl-C61-butyrate, or methyl [6,6]-phenyl-C71-butyrate, and the p-type semiconductor material is preferably 2,2',7,7'-tetra(N,N-p-methoxyanilino)-9,9'-spirobifluorene, nickel oxide, poly[bis(4-phenyl)(2,4,6-trimethylphenyl)amine], and poly-3-hexylthiophene.

In the perovskite radiovoltaic-photovoltaic battery of the present invention, the electrical conductor material of the first electrode and the second electrode is an organic electrically conductive material, an inorganic electrically conductive material, or an electrically conductive material obtained by mixing an organic electrically conductive material and an inorganic electrically conductive material; wherein the organic electrically conductive material is selected from at least one of a polymer of (3,4-ethylenedioxythiophene monomer), polythiophene, polyacetylene, polypyrrole, polyphenylene, polyphenylacetylene, polyaniline, an epoxy resin, a phenolic resin, and polypropylene, and the inorganic electrically conductive material is selected from at least one of a transparent conductive oxide (FTO, ITO, AZO, etc.), a metal, and a carbon derivative.

With regard to the thickness of the various layers in the perovskite radiovoltaic-photovoltaic battery of the present invention, for example, the first electrode has a thickness of 50 nm-1000 nm; the first charge transport layer has a thickness of 10 nm-1000 nm; the perovskite layer has a thickness of 50 nm-2000 nm; the second charge transport layer has a thickness of 10 nm-1000 nm; and the second electrode has a thickness of 10 nm-500 nm.

In the perovskite radiovoltaic-photovoltaic battery of the present invention, when the second charge transport layer is an electron transport layer, the difference between the Fermi level of the second electrode and the conduction band bottom energy level of the second charge transport layer is −1.0-1.0 eV, and the difference between the Fermi level of the second electrode and the valence band top energy level of the second charge transport layer is ≥1.0 eV; when the second charge transport layer is a hole transport layer, the difference between the Fermi level of the second electrode and the valence band top energy level of the second charge transport layer is −1.0-1.0 eV, and the difference between the Fermi level of the second electrode and the conduction band bottom energy level of the second charge transport layer is ≤−1.0 eV.

The difference between the Fermi level of the electrode material and the conduction band bottom energy levels between the electron transport layer materials affects the high-efficient transfer of electrons. When the second charge transport layer is an electron transport layer, by setting the difference between the Fermi level of the second electrode and the conduction band bottom energy level of the second charge transport layer to −1.0-1.0 eV, the collection of electrons by the electrode can be promoted, thus increasing the open-circuit voltage and the electric current; and setting the difference between the Fermi level of the second electrode and the valence band top energy level of the second charge transport layer to a larger value (for example, no less than 1.0 eV), can prevent holes from entering the electrode and recombining with electrons to affect the power generation performance of the battery. When the second charge transport layer is a hole transport layer, the difference between the Fermi level of the second electrode and the valence band top energy level of the second charge transport layer may be set to −1.0-1.0 eV, and the difference between the Fermi level of the second electrode and the conduction band bottom energy level of the second charge transport layer is set to a lager value, for example, no less than −1.0 eV.

In the perovskite radiovoltaic-photovoltaic battery of the present invention, a reflective layer may be provided at an appropriate position. For example, a reflective layer may be provided on the second electrode at the side opposite to the second charge transport layer. The provision of the reflective layer can further improve the energy utilization in the battery.

In another embodiment of the present invention, a method for manufacturing a perovskite radiovoltaic-photovoltaic battery is provided. The method for manufacturing a perovskite radiovoltaic-photovoltaic battery of the present invention is used to manufacture the perovskite radiovoltaic-photovoltaic battery of the present invention, and the method includes: a procedure of forming a first charge transport layer on a first electrode; a procedure of forming a perovskite layer on the first charge transport layer; a procedure of forming a second charge transport layer on the perovskite layer; and a procedure of forming a second electrode on the second charge transport layer; wherein the second electrode is formed by compounding a radioactive source with an electrical conductor material by means of a process selected from at least one of chemical bath deposition, electrochemical deposition, chemical vapor deposition, physical epitaxial growth, thermal evaporation co-evaporation, atomic layer deposition, magnetron sputtering, precursor solution spin coating, precursor solution slit coating, precursor solution blade coating, and mechanical pressing.

The second electrode is preferably formed by compounding by means of at least one process of thermal evaporation co-evaporation process, magnetron sputtering process, and precursor solution spin coating process.

By means of the above-mentioned process, the second electrode is formed by compounding a radioactive source with an electrical conductor material, which can reduce the procedures for battery manufacturing and improve the production efficiency.

EXAMPLES

Hereinafter, the examples of the present application will be explained. The examples described below are exemplary and are merely for explaining the present application, and should not be construed as limiting the present application. The examples in which techniques or conditions are not specified are based on the techniques or conditions described in documents in the art or according to the product introduction. The reagents or instruments used therein for which manufacturers are not specified are all conventional products that are commercially available.

Example 1

A glass substrate with a specification of 2.0 cm×2.0 cm that is covered with an FTO electrically conductive layer of 550 nm is provided; the surface of the FTO electrically conductive glass is sequentially washed with acetone and isopropanol twice, respectively; and then the substrate is immersed into deionized water for an ultrasonic treatment for 10 min, dried in a blast drying oven, and placed in a glove box (an N2 atmosphere), to obtain a first electrode.

The FTO electrically conductive layer is spin-coated with a 3 wt % aqueous solution of $SnO_2$ nano-colloid by a spin coater (LEBO EZ6-S, the same below) at a rotation speed of 5000 rpm, and then heated on a constant-temperature heating table at 150° C. for 15 min to obtain a first charge transport layer with a thickness of 30 nm.

The resulting first charge transport layer is spin-coated with an $FAPbI_3$-DMF solution at a concentration of 1.5 mol/L by a spin coater at a speed of 4500 rpm, and then moved to a constant-temperature heating table and heated at 100° C. for 30 min, and cooled to room temperature to form a perovskite layer with a thickness of 500 nm.

The resulting perovskite layer is spin-coated with a chlorobenzene solution of Spiro-OMeTAD at a concentration of 73 mg/mL by a spin coater at a speed of 4000 rpm, and left to stand for 10-30 min at a normal temperature under an $N_2$ atmosphere to obtain a second charge transport layer with a thickness of 200 nm. The second charge transport layer is a hole transport layer.

The sample that has been formed with the first electrode, the first charge transport layer, the perovskite layer and the second charge transport layer is placed in a vacuum coating machine, and under the vacuum conditions of $5\times10^{-4}$ Pa, $^{63}NiCl_x$ and Ag are co-evaporated onto the surface of the resulting second charge transport layer at an evaporation speed ratio of $^{63}NiCl_x$ to Ag of 0.1:1, so as to obtain a radioactive Ag electrode with a thickness of 80 nm as a second electrode.

Thus, the perovskite radiovoltaic-photovoltaic battery of example 1 is obtained.

Example 2

A sample that is formed, in the same manner as in example 1, with the first electrode, the first charge transport layer, the perovskite layer and the second charge transport layer is placed in a vacuum coating machine, and under the vacuum conditions of $5\times10^{-4}$ Pa, $Ti^3H_4$ and Ag are co-evaporated onto the surface of the resulting second charge transport layer at an evaporation speed ratio of $Ti^3H_4$ to Ag of 0.1:1, so as to obtain a radiating Ag electrode with a thickness of 80 nm as a second electrode.

Thus, the perovskite radiovoltaic-photovoltaic battery of example 2 is obtained.

Example 3

A first electrode is formed in the same manner as in example 1.

The resulting FTO electrically conductive layer is spin-coated with an aqueous solution of NiOx nano-colloid at a concentration of 3 wt % by a spin coater at a speed of 4000 rpm, and then heated on a constant-temperature heating table at 300° C. for 60 min to obtain a first charge transport layer with a thickness of 15 nm.

Next, a perovskite layer is formed on the first charge transport layer in the same manner as in example 1.

The resulting perovskite layer is spin-coated with a PC60BM-chlorobenzene solution at a concentration of 20 mg/mL by a spin coater at a speed of 1500 rpm, and then heated on a constant-temperature heating table at 100° C. for 10 min to obtain a second charge transport layer with a thickness of 60 nm. The second charge transport layer is an electron transport layer.

A sample that has been formed with the first electrode, the first charge transport layer, the perovskite layer and the second charge transport layer is placed in a vacuum coating machine, and under the vacuum conditions of $5\times10^{-4}$ Pa, $^{63}$NiCl$_x$ and Au are co-evaporated onto the surface of the resulting second charge transport layer at an evaporation speed ratio of $^{63}$NiCl$_x$ to Au of 0.1:1, so as to obtain a radiating Au electrode with a thickness of 80 nm as a second electrode.

Thus, the perovskite radiovoltaic-photovoltaic battery of example 3 is obtained.

Example 4

A sample that is formed, in the same manner as in example 1, with the first electrode, the first charge transport layer, the perovskite layer and the second charge transport layer is placed in a vacuum coating machine, and under the vacuum conditions of $5\times10^{-4}$ Pa, Hg$^{35}$S and Ag are co-evaporated onto the surface of the resulting second charge transport layer at an evaporation speed ratio of Hg$^{35}$S to Ag of 0.1:1, so as to obtain a radiating Ag electrode with a thickness of 80 nm as a second electrode.

Thus, the perovskite radiovoltaic-photovoltaic battery of example 4 is obtained.

Comparative Example 1

A perovskite radiovoltaic-photovoltaic battery of comparative example 1 is formed in the same operations as in example 1, excepts that a sample that is formed, in the same manner as in example 1, with the first electrode, the first charge transport layer, the perovskite layer and the second charge transport layer is placed in a vacuum coating machine, and an Ag electrode with a thickness of 80 nm is evaporated onto the surface of the resulting second charge transport layer under the vacuum conditions of $5\times10^{-4}$ Pa.

Comparative Example 2

A sample that is formed, in the same manner as in example 1, with the first electrode, the first charge transport layer, the perovskite layer, and the second charge transport layer is placed in a vacuum coating machine, and under the vacuum conditions of $5\times10^{-4}$ Pa, an Ag electrode layer with a thickness of 80 nm is evaporated as the second electrode; then the evaporation source is replaced with $^{63}$NiCl$_x$, and a radioactive source layer with a thickness of 10 nm is evaporated onto the surface of the second electrode, thus forming the perovskite radiovoltaic-photovoltaic battery of comparative example 2.

Perovskite Radiovoltaic-Photovoltaic Battery Performance Tests

The performance of the perovskite radiovoltaic-photovoltaic batteries in examples and comparative examples are tested.

Specifically, under atmospheric environment, an AM1.5G standard light source is used as the sunlight simulation light source, and the volt-ampere characteristic curve of the battery under the illumination of the light source is measured by a four-channel digital source meter (Keithley 2440) to obtain the open-circuit voltage Voc, the short-circuit current density Jsc, and the fill factor FF (Fill Factor) of the battery; thus, the energy conversion efficiency Eff (Efficiency) of the battery can be calculated. The energy conversion efficiency of the battery is calculated by the following formula:

$$Eff = Pout/Popt$$
$$= Voc \times Jsc \times (Vmpp \times Jmpp)/(Voc \times Jsc)$$
$$= Voc \times Jsc \times FF$$

where Pout, Popt, Vmpp, and Jmpp respectively represent the working output power of the battery, the incident light power, the voltage at the largest power point of the battery, and the current at the largest power point of the battery.

At normal temperature and pressure, the energy band distribution of the charge transport layers and electrodes is tested using an X-ray photoelectron spectrometer (XPS) with a model of Escalab 250Xi (from Thermo Scientific).

The results are shown in Table 1.

| | Open-circuit voltage (V) | Short-circuit current density (mA/cm$^2$) | Fill factor (%) | Valence band top energy level of second charge transport layer (eV) | Conduction band bottom energy level of second charge transport layer (eV) | Fermi level of radiating electrode (V) | Energy conversion efficiency of battery (%) |
|---|---|---|---|---|---|---|---|
| Example 1 | 1.16 | 24.2 | 77.0 | −5.2 | −2.3 | −4.8 | 21.6 |
| Example 2 | 1.16 | 24.0 | 76.5 | −5.2 | −2.3 | −4.5 | 21.3 |
| Example 3 | 1.15 | 23.7 | 76.3 | −6.0 | −4.3 | −4.9 | 20.8 |
| Example 4 | 1.13 | 23.6 | 75.8 | −5.2 | −2.3 | −4.0 | 20.2 |
| Comparative example 1 | 1.10 | 23.4 | 75.8 | −5.2 | −2.3 | — | 19.5 |
| Comparative example 2 | 1.14 | 23.4 | 75.5 | −5.2 | −2.3 | — | 20.1 |

From the comparison between examples 1-4 and comparative example 1, it can be seen that the energy conversion efficiency of the battery can be improved by forming a radiating second electrode.

From the comparison between example 1 and comparative example 2, it can be seen that forming a radiating electrode not only can improve the energy conversion efficiency of the battery, but also can form the electrode and the radioactive source in an integral manner, which reduces procedures and the thickness of the electrode layer and the radioactive source and realizes the miniaturization of the battery, compared to forming an electrode layer and a radioactive source layer respectively.

From the comparison between examples 1-3 and example 4, it can be seen that the difference between the Fermi level of the second electrode and the conduction band bottom energy level of the second charge transport layer and the difference between the Fermi level of the second electrode and the valence band top energy level of the second charge transport layer can meets a specific range by selecting the materials of the various layers, making it possible to obtain a much better energy conversion efficiency of the battery.

It should be noted that the present application is not limited to the above embodiments. The above embodiments are exemplary only, and any embodiment that has substantially same constitutions as the technical ideas and has the same effects within the scope of the technical solution of the present application falls within the technical scope of the present application. In addition, without departing from the gist of the present application, various modifications that can be conceived by those skilled in the art to the embodiments, and other modes constructed by combining some of the constituent elements of the embodiments also fall within the scope of the present application.

The invention claimed is:

1. A perovskite radiovoltaic-photovoltaic battery, wherein
the perovskite radiovoltaic-photovoltaic battery has a first electrode, a first charge transport layer, a perovskite layer, a second charge transport layer, and a second electrode in sequence,
wherein the first electrode is a transparent electrode,
the first charge transport layer is an electron transport layer and the second charge transport layer is a hole transport layer, or the first charge transport layer is a hole transport layer and the second charge transport layer is an electron transport layer, and
the second electrode is a radiating electrode formed by compounding an electrical conductor material with a radioactive source.

2. The perovskite radiovoltaic-photovoltaic battery of claim 1, wherein
the radioactive source is selected from at least one of an α-type radioactive source, a β-type radioactive source, an X-ray radioactive source and a γ-ray radioactive source.

3. The perovskite radiovoltaic-photovoltaic battery of claim 2, wherein
the α-type radioactive source is selected from at least one of $^{210}$Po or a compound thereof, $^{228}$Th or a compound thereof, $^{235}$U or a compound thereof, $^{238}$Pu or a compound thereof, $^{238}$PuO$_2$ microspheres, $^{241}$Am or a compound thereof, $^{242}$Cm or a compound thereof, and $^{244}$Cm or a compound thereof; and
the β-type radioactive source is selected from at least one of $(C_4H_3{}^3H_{5-})_n$, $^3H_2$, Ti$^3$H$_4$, $^{14}$C or a compound thereof, $^{35}$S or a compound thereof, $^{63}$Ni or a compound thereof, $^{90}$Sr or a compound thereof, $^{90}$Sr/$^{90}$Y, $^{99}$Tc or a compound thereof, $^{106}$Ru or a compound thereof, $^{137}$Cs or a compound thereof, $^{144}$Ce or a compound thereof, $^{147}$Pm or a compound thereof, $^{151}$Sm or a compound thereof, and $^{226}$Ra or a compound thereof.

4. The perovskite radiovoltaic-photovoltaic battery of claim 2, wherein
the radioactive source is selected from at least one of Ti$^3$H$_4$, $^{63}$Ni or a compound thereof, and $^{90}$Sr/$^{90}$Y.

5. The perovskite radiovoltaic-photovoltaic battery of claim 1, wherein
the content of the radioactive source in the radiating electrode is no more than 90 wt %.

6. The perovskite radiovoltaic-photovoltaic battery of claim 1, wherein
the first charge transport layer and the second charge transport layer has a semiconductor material of at least one of the following materials and derivatives thereof: an imide compound, a quinone compound, fullerene and a derivative thereof, poly[bis(4-phenyl)(2,4,6-trimethylphenyl)amine], 2,2',7,7'-tetra(N,N-p-methoxyanilino)-9,9'-spirobifluorene, methoxytriphenylamine-fluoroformamidine, poly(3,4-ethylenedioxythiophene): polystyrene sulfonic acid, poly-3-hexylthiophene, triptycene-cored triphenylamine, 3,4-ethylenedioxythiophene-methoxytriphenylamine, N-(4-aniline)carbazole-spirobifluorene, polythiophene, a metal oxide, with the metal element being selected from Mg, Ni, Cd, Zn, In, Pb, Mo, W, Sb, Bi, Cu, Hg, Ti, Ag, Mn, Fe, V, Sn, Zr, Sr, Ga, or Cr, silicon oxide, strontium titanate, calcium titanate, lithium fluoride, calcium fluoride, cuprous thiocyanate, methyl [6,6]-phenyl-C61-butyrate, or methyl [6,6]-phenyl-C71-butyrate.

7. The perovskite radiovoltaic-photovoltaic battery of claim 1, wherein
the electrical conductor material of the first electrode and the second electrode is an organic electrically conductive material, an inorganic electrically conductive material, or an electrically conductive material obtained by mixing an organic electrically conductive material and an inorganic electrically conductive material,
the organic electrically conductive material is selected from at least one of a polymer of (3,4-ethylenedioxythiophene monomer), polythiophene, polyacetylene, polypyrrole, polyphenylene, polyphenylacetylene, polyaniline, an epoxy resin, a phenolic resin, and polypropylene, and
the inorganic electrically conductive material is selected from at least one of a transparent conductive oxide, a metal, and a carbon derivative.

8. The perovskite radiovoltaic-photovoltaic battery of claim 1, wherein
the perovskite in the perovskite layer has a chemical formula of ABX$_3$, where A is selected from at least one of a methylamine cation of MA$^+$, a formamidine cation of FA$^+$, and a cesium cation of Cs$^+$, B is selected from at least one of a lead cation of Pb$^{2+}$ and a tin cation of Sn$^{2+}$, and X is selected from at least one of a halide anion, and COO$^-$.

9. The perovskite radiovoltaic-photovoltaic battery of claim 1, wherein the first electrode has a thickness of 50 nm-1000 nm; and/or
the first charge transport layer has a thickness of 10 nm-1000 nm; and/or
the perovskite layer has a thickness of 50 nm-2000 nm; and/or
the second charge transport layer has a thickness of 10 nm-1000 nm; and/or
the second electrode has a thickness of 10 nm-500 nm.

10. The perovskite radiovoltaic-photovoltaic battery of claim 1, wherein
when the second charge transport layer is an electron transport layer, the difference between the Fermi level of the second electrode and the conduction band bottom energy level of the second charge transport layer is −1.0-1.0 eV, and the difference between the Fermi level of the second electrode and the valence band top energy level of the second charge transport layer is ≥1.0 eV.

11. The perovskite radiovoltaic-photovoltaic battery of claim 1, wherein
when the second charge transport layer is a hole transport layer, the difference between the Fermi level of the second electrode and the valence band top energy level of the second charge transport layer is −1.0-1.0 eV, and the difference between the Fermi level of the second electrode and the conduction band bottom energy level of the second charge transport layer is ≤−1.0 eV.

12. A method for manufacturing a perovskite radiovoltaic-photovoltaic battery having a first electrode, a first charge transport layer, a perovskite layer, a second charge transport layer, and a second electrode in sequence, the method includes:
a procedure of forming a first charge transport layer on a first electrode,
a procedure of forming a perovskite layer on the first charge transport layer,
a procedure of forming a second charge transport layer on the perovskite layer, and
a procedure of forming a second electrode on the second charge transport layer,
wherein the first electrode is a transparent electrode,
the first charge transport layer is an electron transport layer and the second charge transport layer is a hole transport layer, or the first charge transport layer is a hole transport layer and the second charge transport layer is an electron transport layer,
the second electrode is a radiating electrode formed by compounding an electrical conductor material with a radioactive source, and
the second electrode is formed by compounding an electrical conductor material with a radioactive source by means of a process selected from at least one of chemical bath deposition, electrochemical deposition, chemical vapor deposition, physical epitaxial growth, thermal evaporation co-evaporation, atomic layer deposition, magnetron sputtering, precursor solution spin coating, precursor solution slit coating, precursor solution blade coating, and mechanical pressing.

13. The method of claim 12, wherein
the second electrode is formed by compounding an electrical conductor material with a radioactive source by at least one process of thermal evaporation co-evaporation, magnetron sputtering, and precursor solution spin coating.

14. The perovskite radiovoltaic-photovoltaic battery of claim 1, wherein
the content of the radioactive source in the radiating electrode is 5-30 wt %.

* * * * *